US005612968A

United States Patent [19]
Zah

[11] Patent Number: 5,612,968
[45] Date of Patent: Mar. 18, 1997

[54] REDUNDANT MULTI-WAVELENGTH LASER ARRAYS

[75] Inventor: Chung-en Zah, Holmdel, N.J.

[73] Assignee: Bell Communications Research, Inc., Morristown, N.J.

[21] Appl. No.: 425,565

[22] Filed: Apr. 20, 1995

[51] Int. Cl.[6] .................................................. H01S 3/10
[52] U.S. Cl. .............................................. 372/50; 372/20
[58] Field of Search ........................................ 372/50, 20

[56] References Cited

U.S. PATENT DOCUMENTS 5,515,391  5/1996  Endriz ........................................ 372/34

OTHER PUBLICATIONS

Zah et al., "Multiwavelength light source with integrated DFB laser array and star coupler for WDM lightwave communications," *International Journal of High Speed Electronics and Systems*, vol. 5, No. 1, 1994, pp. 91–109 (No Month).

Zah et al., "Monolithic integrated multiwavelength laser arrays for WDM lightwave systems," *Optoelectronics—Devices and Technologies*, vol. 9, No. 2, 1994, Jun.

Green, Jr., *Fiber Optics Networks*, (Prentice–Hall, 1993), pp. 200–204, 353–391 (No Month).

Brackett et al., "A scalable multiwavelength multihop optical network: A proposal for research on all-optical networks," *Journal of Lightwave Technology*, vol. 11, 1993, pp. 736–753 May/Jun.

*Primary Examiner*—James W. Davie
*Attorney, Agent, or Firm*—Joseph Giordano; James W. Falk

[57] ABSTRACT

A semiconductor integrated-circuit laser array including redundant lasers that is particularly useful in a wavelength-division multiplexed communication system requiring N channels regularly spaced in wavelength. According to a first aspect of the invention, a plurality of lasers are designed to operate at the same wavelength so that a single inoperative laser will not prevent the laser array from operating. Further, sets of lasers are chosen which have wavelength spacings closest to the design spacing. According to a second aspect of the invention, the laser array includes lasers with spacings in between the design wavelengths. Thereby, if all the lasers systematically vary in wavelength, a set of lasers can be selected that will operate not far from their nominal operating wavelength.

10 Claims, 3 Drawing Sheets

REDUNDANT MULTI-WAVELENGTH LASER ARRAYS

GOVERNMENT INTEREST

The invention was made under government agreement MDA972-92-H-0010. The government has certain interests in the invention.

FIELD OF THE INVENTION

The invention relates generally to semiconductor lasers. In particular, the invention relates to multi-wavelength semiconductor laser arrays.

BACKGROUND ART

Optical fiber is quickly replacing copper wire and coaxial cable for long-distance transmission in the telephone network. It is also being extended closer to the end user in the local telephone and cable networks. Typically, it has simply replaced the copper line in a point-to-point architecture in which an electrical signal modulates a laser transmitter that produces the single-frequency light conveyed on the fiber. At the receiving end, an optical detector demodulates the optical signal to an electrical signal equivalent to that carried on the copper line. Switching at network nodes is performed on the electrical signals. Therefore, each node requires demodulation and modulation, which at the desired high data rates demand expensive components. High-speed networks almost always imply that the physical channel is time division multiplexed (TDM) between a number of lower-speed logical channels, and the switch allows the different logical channels to be switched in different directions.

Such an approach is, however, limited in the amount of data that can be carried by a single fiber. The electronics at the transmitter and receiver have been pushed to 2.5 gigabits per second ($2.5 \times 10^9$ Gb/s), and further increases become difficult. About the same limitation in data pulse rate is presented by optical dispersion in the fiber over reasonable transmission lengths. Such data rates utilize only a tiny portion of the bandwidth available in optical fiber, which is at least 30 terahertz ($3 \times 10^{13}$ Hz).

The aggregate data rate can be significantly increased by wavelength division multiplexing (WDM) in which an array of lasers are tuned to output different optical frequencies (wavelengths) and are modulated by different electrical data signals. Their multi-wavelength outputs are combined onto a single fiber, and at the receiving end optical or other means separate the optical-frequency components to be detected by different optical detectors. Although WDM affords large increases in data throughput proportional to the number of wavelengths, it does not, at least as described above, address the problem of demodulating and modulating at each switching node and the requirement for expensive high-capacity switches. These problems are described by Zah et al. in "Multiwavelength light source with integrated DFB laser array and star coupler for WDM lightwave communications," *International Journal of High Speed Electronics and Systems*, vol. 5, no. 1, 1994, pp. 91–109 (hereinafter Zah I), and in "Monolithic integrated multiwavelength laser arrays for WDM lightwave systems," *Optoelectronics-Devices and Technologies*, vol. 9, no. 2, 1994 (hereinafter Zah II), and further references are cited therein.

New network architectures, generally referred to as all-optical networks, are being developed to solve these problems. Green, Jr. gives a general discussion in *Fiber Optics Networks*, (Prentice-Hall, 1993), especially at pp. 353–391. All optical networks are expected to switch optical signals without the necessity of converting them down to electrical signals. Brackett et al. describe one such architecture in "A scalable multiwavelength multihop optical network: A proposal for research on all-optical networks," *Journal of Lightwave Technology*, vol. 11, 1993, pp. 736–753. A very simplified version of such a WDM all-optical network, shown in FIG. 1, relies on four optical wavelengths $\lambda_1$, $\lambda_2$, $\lambda_3$, and $\lambda_4$ for connecting four end stations $E_1$, $E_2$, $E_3$, $E_4$. A receiving optical fiber 10 and a transmitting optical fiber 12 connect each end station to a coupler 14. Each end station receives signals at one wavelength from the receiving optical fiber 10 but can transmit on the transmitting optical fiber 12 at one or all of the other wavelengths associated with respective ones of the other end stations. For example, end station $E_1$ receives data on an optical carrier having wavelength $\lambda_1$ and transmits data bound for end station $E_2$ on an optical carrier having wavelength $\lambda_2$, etc. The coupler 14 receives a signal from a transmitting optical fiber 12 at a given wavelength from one end station and retransmits it on the receiving optical fiber 10 to the end station with which that wavelength is associated. In a rudimentary form, the coupler is a star coupler that transmits all signals received from transmitting optical fibers 12 to all receiving optical fibers 10 while the end stations process only the wavelength signals assigned to them. However, the coupler 14 may be considerably more complex than a star coupler. In general, it may be a communication network with nodes and end stations therein, but the general concepts of FIG. 1 nonetheless apply. All-optical networks of more complexity are described by Green, Jr. at pp. 353–391.

Although the optical switching units of the optical coupling unit present some of the most innovative challenges of the components in the all-optical network, the laser transmitters may be the limiting technology. Multiwavelength laser arrays are well known that are integrated on a single optoelectronic chip and that generate laser light at a number of fairly well defined wavelengths. The light propagates parallel to the plane of the chip and generally exits the chip at its edge. These laser arrays have an array of distributed feedback (DFB) semiconductor lasers in which the free-space emission wavelength $\lambda$ of the individual distributed feedback lasers is determined by the period $\Lambda$ of a grating longitudinally imposed on the separate lasers and $n_{\mathit{eff}}$, the effective refractive index of the waveguide. The relationship is simply given by $$\lambda = 2n_{\mathit{eff}}\Lambda \tag{1}$$

The general theory and structure of DFB and equivalent lasers is described by Green, Jr. ibid., especially at pp. 200–204. The array is typically designed to have a number N of lasers whose output wavelengths are separated by $\Delta\lambda$ so that the array is represented by a lasing wavelength comb. In extended networks, erbium-doped fiber amplifiers are used to maintain signal levels. These amplifiers have a relatively narrow amplification band. Also, optical switches and lasers have limited spectral resolution. In view of the restraints imposed by available components, the presently envisioned architecture for an all-optical network is limited to a channel separation $\Delta\lambda \approx 4$ nm or somewhat less and the number of channels are limited to the bandwidth of erbium-doped fiber amplifiers of approximately 35 nm.

In reality, such laser arrays are very difficult to achieve because many factors affect the wavelength $\lambda$, which must be very tightly controlled. For such a network, each laser transmitter within the network must have its frequencies calibrated with the other laser transmitters in the network so that all the combs coincide. Active temperature control can partially solve the problem. Insofar as the comb spacing $\Delta\lambda$ is maintained constant but the comb of one array is uniformly displaced up or down by fabricational variations, the comb can be brought into registry with the system standard by varying the array's temperature. The lasing wavelength of a DFB laser red shifts at a rate of about 0.1 nm/°C. (12.5 GHz/°C. at 1.55 μm) due to the temperature dependence of the waveguide effective refractive index. But, such temperature control has the potential disadvantage of requiring the lasers to operate far from their design temperature.

Furthermore, the comb wavelength spacing $\Delta\lambda$ for a laser array cannot be guaranteed and is subject to its own variation $\delta\lambda$ due to a number of non-uniformities. See Zah I for a full discussion. Unless the variations $\delta\lambda$ for all the N lasers in an array can be kept below a minimum value (which necessarily decreases as $\Delta\lambda$ decreases with increasing N), the array is defective for use within the network. If the yield per laser is $y_1$, that is, a fraction $y_1$ of lasers have an acceptable wavelength tolerance $\delta\lambda_{max}$, the yield $y_a$ for an array of N lasers is $$y_a = y_1^N \qquad (2)$$

Thus, yields can drop to unacceptably low levels for the larger arrays required of realistic networks, particularly if the single-laser yields $y_1$ are marginal to begin with.

SUMMARY OF THE INVENTION

Accordingly, an object of the invention is to provide a multiwavelength laser array that can accommodate any intrinsic variation in the wavelengths set by the laser array.

A further object is to raise the yield of multiwavelength laser arrays.

The invention can be summarized as an array of semiconductor lasers for use in a system requiring N wavelengths. The invention uses redundant lasers having the same wavelength so that one laser of each wavelength is selected and the set of selected lasers both operate satisfactorily and have a satisfactory wavelength spacing between the lasers of the set. The invention also uses redundant lasers in which extra lasers are introduced having nominal wavelengths intermediate those of the design such that, if the entire set drifts off wavelength, lasers can be selected that more closely conform to the design wavelengths.

DETAILED DESCRIPTION OF THE PREFERRED EMBODIMENTS

The invention provides redundancy in a semiconductor laser array for at least two purposes, an increase in array yield and reduced temperature compensation.

Figure 2:
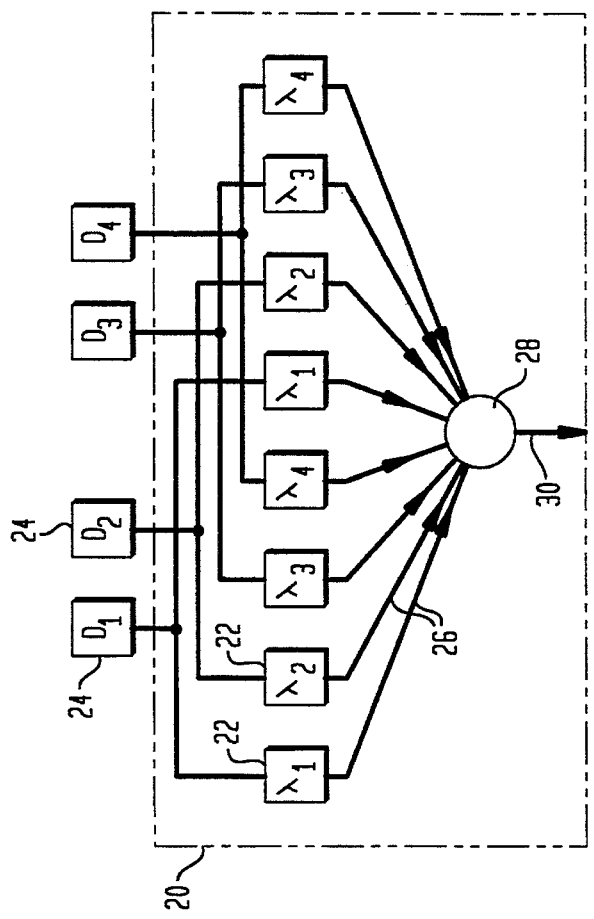
FIG. 2 is a schematic plan view of an array of redundant semiconductor lasers.

In a first embodiment of the invention, illustrated in schematic plan view in FIG. 2, an integrated semiconductor opto-electronic chip 20 includes a plurality of separately modulatable semiconductor lasers 22 emitting at a plurality of redundant wavelengths. In the example, eight lasers 22 are designed to emit at four wavelengths $\lambda_1$, $\lambda_2$, $\lambda_3$, and $\lambda_4$ so that, at each wavelength $\lambda_i$, two lasers emit at or near that nominal wavelength. As discussed before, the actual emission wavelength depends both on temperature and other factors uniform across the chip 20 and, more importantly for this embodiment, upon yet other factors that are non-uniform across the chip 20. Typically, the two lasers of the same nominal wavelength are intended to have the same grating period $\Lambda$, but other inaccuracies dominate the deviation from the design wavelength.

The lasers are electrically connectable to four data sources 24 that modulate or otherwise impress data signals upon the lasers 22. In particular, in the preferred embodiment, one and only one of the lasers of a particular emitting wavelength is connected to its respective data source 24. Optical waveguides 26, typically semiconductor waveguides on-board the chip 20, interconnect the outputs of the semiconductor lasers 20 to an optical combiner 28 which combines all the optical signals to a single output channel or waveguide 30, which is typically coupled off-chip to a single optical fiber. The combiner 28 may be a single-output star coupler. Alternatively, the outputs of the lasers 20 may be connected to separate output fibers and directed in different directions according to the network architecture.

However, only one of the lasers 22 at each wavelength $\lambda_i$ is ultimately connected to its corresponding data source 24 or to the combiner 28. The other laser 22 at this wavelength $\lambda_i$ is somehow not connected. The connection and non-connection can be effected by burning a fuse or by selective bonding of lead wires or by other means. Thus, each data source $D_i$ or 24 modulates only a single laser 22 at the corresponding design wavelength $\lambda_i$. The lasers 22 are selected for connection or disconnection after the opto-electronic chip 20 has been fabricated. Methods are well known to probe such chips prior to wire bonding or packaging. The actual emission wavelength of each laser 22 is tested. In this case, two lasers 22 output at the same nominal emission wavelength. A set of four lasers 22 of different wavelength $\{\lambda_j\}$ are then selected which not only emit with satisfactory intensity but which also as a set presents the lowest total variation $\{\delta\lambda_i\}$ for all four lasers of the four wavelengths $\{\lambda_i\}$, e.g., as measured by the root mean square. If no such set can be found for which each member is above a minimally acceptable $\delta\lambda_{max}$, then the chip is rejected as defective.

The redundancy greatly increases the yield for marginally acceptable chips since the total array yield for a redundancy r (here r=2) is $$y_a = (1-(1-y_1)^r)^N \qquad (3)$$

Table 1 shows the array yields $y_a$ that have been calculated by Zah II for a set of DFB laser arrays they fabricated and for which a tolerance of $\delta\lambda_{max} \leq \pm 0.5$ nm is required. Lower tolerances would produce significantly lower yields.

TABLE 1

| N | r = 1 | r = 2 |
|---|-------|-------|
| 1 | 74%   | 93%   |
| 4 | 30%   | 76%   |
| 8 | 9%    | 57%   |
| 16| 0.8%  | 33%   |

It is nonetheless seen that even for these circumstances, simple redundancy can provide significant improvements in yield.

The array yield given by Equation (3) assumes that the variation of each laser is random; this situation is often not true. If a defect is caused by a defect or particle shared by neighboring lasers, then those neighboring lasers are likely to exhibit similar variation. Similarly, if a fabricational variation has a period of a length greater than the spacing of several lasers, then those lasers will be similarly affected. Since such spatial correlation is often present, it is advisable to place the redundant lasers of the same nominal wavelength as far apart as possible so as to decorrelate the fatal defects while for spatial variations the lasers of a single set should be placed closely together so that they are all similarly affected. This placement is accomplished in the arrangement of FIG. 2 in which no two lasers of the same nominal wavelength $\lambda_i$ are placed next to each other and in which the lasers of the different redundant sets are physically separated from each other. Such placement will further increase the array yield $y_a$.

Figure 3:
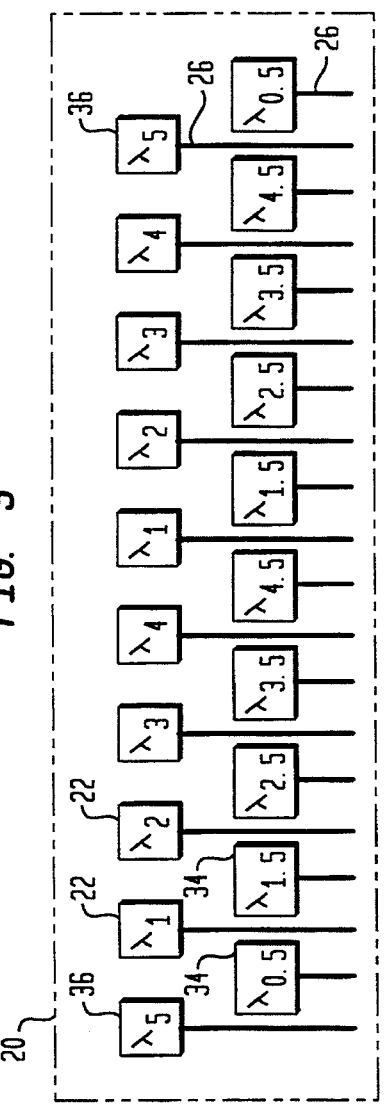
FIG. 3 is a schematic plan view of an array of redundant semiconductor lasers including frequency interleaving.
Figure 1:
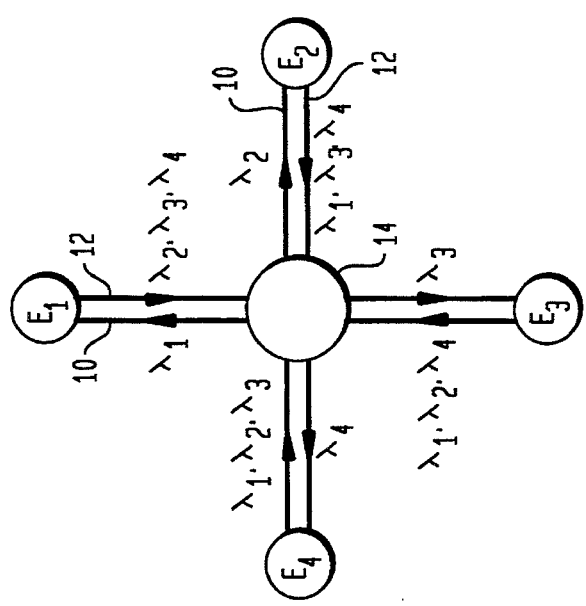
FIG. 1 is a schematic of a wavelength division multiplexed communications network with which the invention is usable.

While the configuration of FIG. 2 largely accommodates defects and spatial variations between lasers, it does not address the variations which affect most of the lasers in an array. Although the uniform variations can be largely controlled by temperature, as stated above, temperature control has its limits and drawbacks. It would be preferable to restrict temperature control to ±10° C. A worst case occurs if the actual wavelength comb falls midway between the design wavelengths. This case can be accommodated if, as illustrated in FIG. 3, additionally redundant lasers have wavelengths designed to fall between the design wavelengths. For a four-wavelength system having nominal design wavelengths $\lambda_1$, $\lambda_2$, $\lambda_3$, and $\lambda_4$, redundant lasers 34 are added having wavelengths at the half intervals between those wavelengths and at half intervals on the outsides, i.e., at wavelengths $\lambda_{0.5}$, $\lambda_{1.5}$, $\lambda_{2.5}$, $\lambda_{3.5}$, and $\lambda_{4.5}$, where for instance $\lambda_{1.5}=(\lambda_2-\lambda_1)/2$ or alternatively $\lambda_{1.5}=\lambda_1+\Delta\lambda/2$. Preferably, each half-interval lasers 34 is physically located at positions between the principal lasers 22 having wavelengths bracketing that of the redundant laser 34 so any local variation nearly equally affects these three lasers 22 and 34. If the large-period variations are such that the true wavelengths fall nearly between the design wavelengths, then the lasers 34 with interleaved frequencies are instead used. All unused lasers 22 and 34 are not connected to the corresponding data source 24. This type of redundancy prevents the necessity for temperature compensation of more than $\Delta\lambda/4$ rather than the maximum of $\Delta\lambda/2$ in the architecture of FIG. 2. It is believed that the temperature compensation can be maintained within ±10° C. of room temperature. This intra-interval compensation is particularly useful where the wavelength spacing is greater than 4 nm.

This concept can be further extended to additional outside full-interval lasers 36 having design frequencies $\lambda_0$ and/or $\lambda_5$ lying a full wavelength interval $\Delta\lambda$ outside the designed wavelength comb. The channel with wavelength $\lambda_0$ is not illustrated but is understood to lie at the lower side of the channel $\lambda_1$ by $\Delta\lambda$. Thereby, the wavelength variation which can be temperature compensated can be doubled, whether with or without the half-interval redundancy.

Of course, both the intra-interval redundancy of the lasers 34 or the outside redundancy of the lasers 36 can be further extended by further intra-interval lasers 34 which are smaller fractions of the interval $\Delta\lambda$ or by further outside lasers 36 having wavelength spacings that are higher multiples of the interval $\Delta\lambda$.

The size of the laser array chip 20 is primarily determined by the optical and electric interfaces, such as the required physical spacing of the fiber array and the electronic driver array, rather than the area occupied by just the lasers. Therefore, the physical size of the laser array chip 20 is proportional to the number N of wavelength channels and is not proportional to the number r of redundant lasers that may be selected for each channel, especially in a chip wherein the different wavelength signals are combined on-chip by a star coupler or a wavelength multiplexer.

EXAMPLE 1

The invention has been tested for the Optical Networks Technology Consortium. In its first phase, four wavelengths were designated at 1546, 1550, 1554, and 1558 nm. The DFB basic laser structure and the entire integrated optoelectronic chip are described by Zah I and Zah II. The lasers used an InP/InGaAsP/InP pn double heterostructure. The laser array was fabricated with twenty lasers 22, 34, and 36 having nominal wavelengths and positions as illustrated in FIG. 3. The interval $\Delta\lambda$ was 4 nm for both the principal and intra-interval lasers so that the lasers 22, 34, and 36 were most closely spaced by an emission wavelength separation of 2 nm. Physically, the lasers were laterally spaced at a period of 250 μm.

Figure 4:
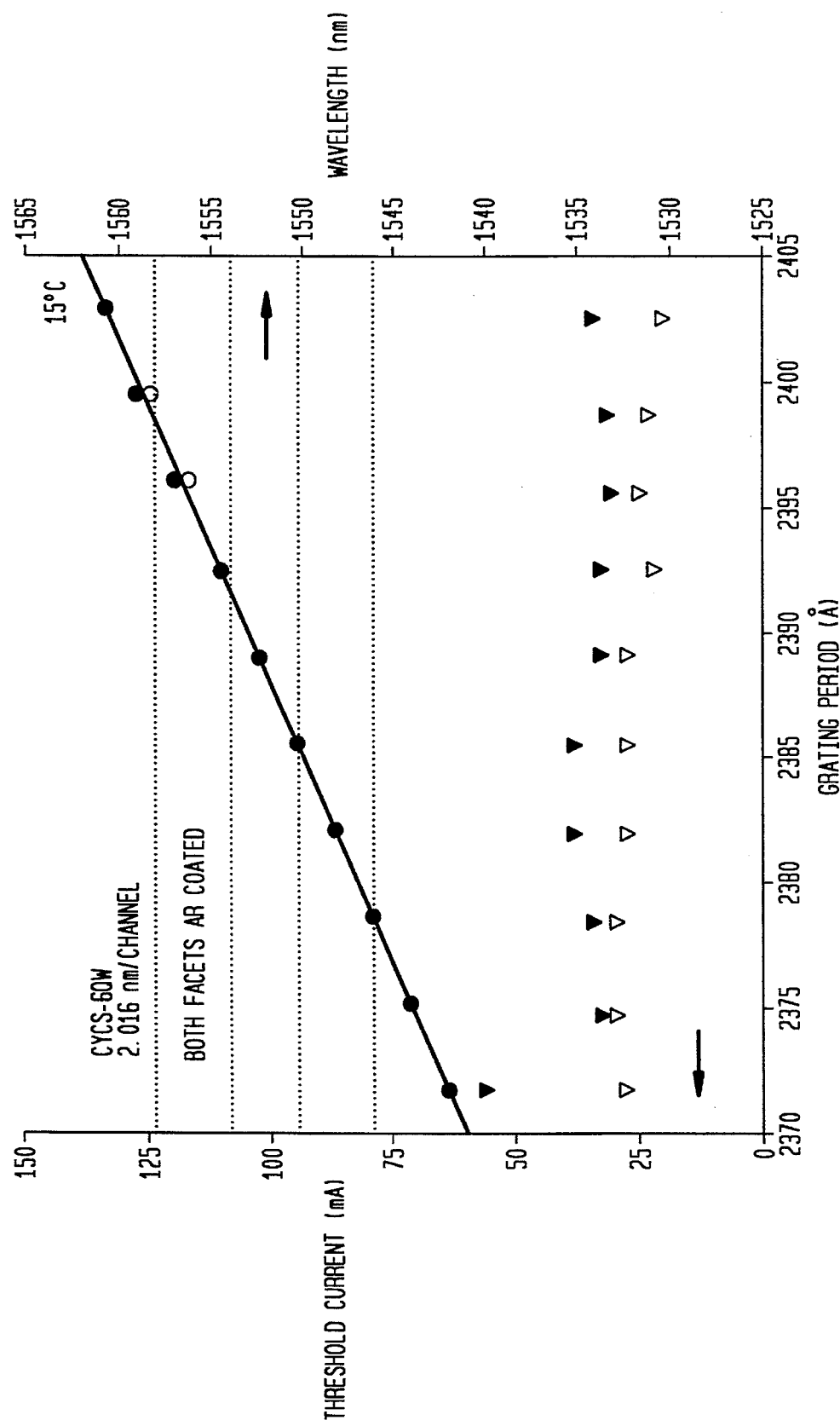
FIG. 4 is a graph showing experimental results of the measured frequency and threshold current for redundant laser array of FIG. 3

FIG. 4 is a graph showing both the lasing wavelength and the threshold current for the twenty lasers of FIG. 3, where the open and closed circles or triangles represent the right-hand and left-hand redundancy of FIG. 3. The horizontal dotted lines represent the design frequency comb for the network. The redundancy allows a selection of those lasers having wavelengths closest to the wavelength characteristic of the network. Although the same-frequency redundancy produces lasers having nearly the same frequency output in the example, such is not guaranteed in production.

EXAMPLE 2

Figure 5:
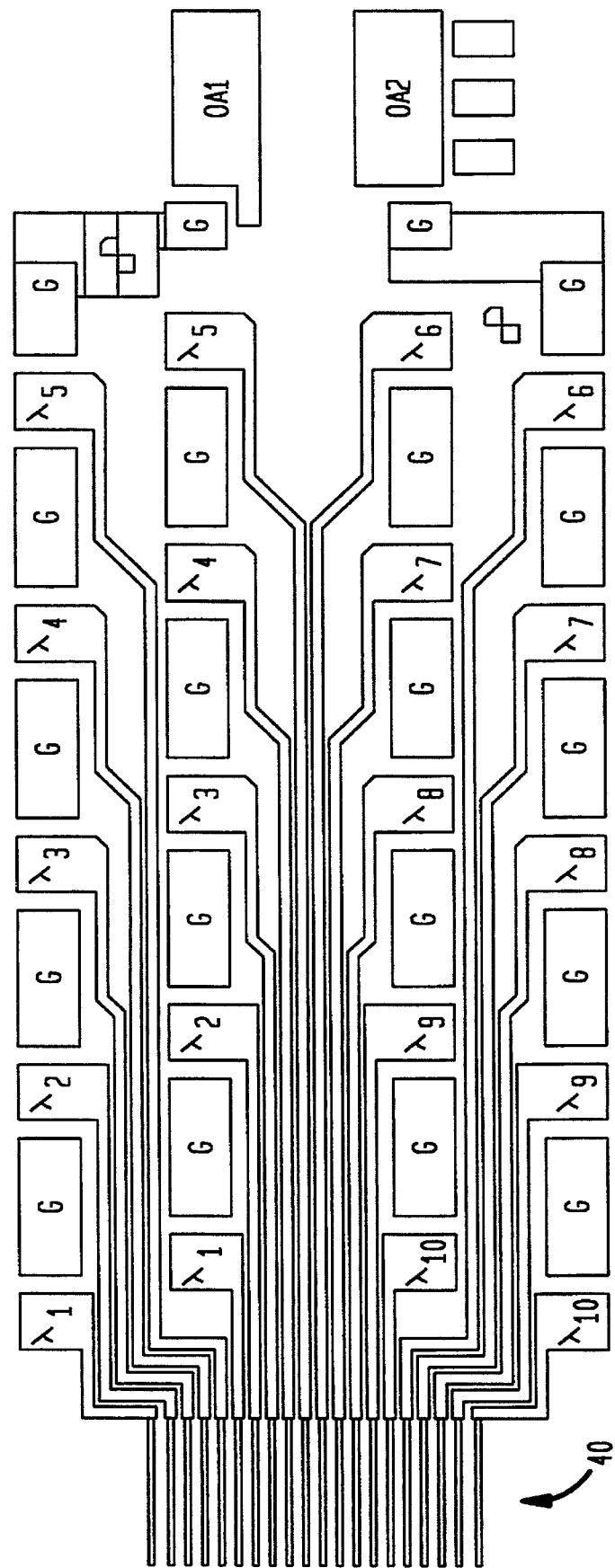
FIG. 5 is a plan view of an opto-electronic integrated circuit for eight channels with frequency redundancy.

In the second phase of ONTC, the eight designated wavelengths were 1546, 1548, 1550, 152, 1554, 1556, 1558, and 1560 nm. Simple wavelength redundancy has been implemented with the laser array 40 illustrated in plan view in FIG. 5, which emphasizes the bonding pads. The redundancy provides double frequency redundancy and one outside redundant wavelength on each side. A star coupler has been integrated with the lasers on a single chip measuring 4300×1440 μm². The lasers are physically spaced at 50 μm. Two lasers are designed with the same wavelength, and the two lasers of the same wavelength are physically separated far away from each other, but their pads are nearby each other. Because of the high modulation rates, each signal pad has an associated ground pad separated therefrom by 250 μm. The configuration of lasers and pads provides both high array yield and easy wire bonding to the electronic drivers.

Although the invention has been described in terms of DFB lasers having the gratings imposed upon the gain portion of the lasers, the invention is also applicable to semiconductor laser arrays in which other types of tuning means are physically incorporated into the separated lasers of the array.

The invention thus provides an array of laser data modulators which can be easily calibrated to a network registration standard without an excessive range of temperature control.

What is claimed is:

1. A semiconductor laser array comprising a first plurality of lasers fabricated on a chip and including self-tuning means to cause each laser to have one of a plurality of design lengths, a second plurality of lasers on said chip, each of said second plurality of lasers having the same design wavelength as one of said first plurality of lasers, and means for operatively connecting only one of said first and said second plurality of lasers between a data source and an output for each of said design frequencies.

2. A semiconductor laser array as recited in claim 1, wherein said self-tuning means comprises gratings imposed on respective ones of said lasers.

3. A semiconductor laser array as recited in claim 1, wherein said second plurality of lasers having said same design wavelength are disposed laterally with at least one other of said first plurality of lasers not having said same design wavelength disposed therebetween.

4. A semiconductor laser array for an end station of a wavelength-division multiplexed communication network to which it is connected by a coupling medium, said laser array comprising an optoelectronic circuit chip having integrated therein a first plurality of lasers each for emitting optical electrical signals at one of a first plurality of respective design wavelengths and a second plurality of laser each for emitting signals at one of said first plurality of respective design wavelengths, only one of said first and second plurality of lasers at each respective design wavelength being actively coupled to emit optical signals to the coupling medium.

5. A semiconductor laser array in accordance with claim 4 and further comprising a third plurality of lasers integrated in said optoelectronic circuit chip, the communication network being designed to operate with an optical channel spacing of $\Delta\lambda$ and said lasers of said third plurality having design wavelengths separated by a fractional wavelength spacing $\Delta\lambda/m$, where m is an integer, and at least one of said third plurality lasers being actively coupled to emit optical signals to the coupling medium in place of one of said first and second array lasers.

6. A semiconductor laser array in accordance with claim 5 wherein at least certain of said lasers of said third plurality have the same respective design wavelength.

7. A semiconductor laser array for use in a communication network requiring different optical carrier wavelengths, said array comprising an optoelectronic circuit chip and a plurality of individual lasers in said chip, said lasers comprising a first plurality of lasers designed to operate at different optical carrier wavelengths, a second plurality of redundant lasers each designed to operate at a carrier wavelength of one of said first plurality of lasers, and a third plurality of redundant lasers designed to operate at carrier wavelengths intermediate at last some of the carrier wavelengths of the communication network.

8. A semiconductor laser array in accordance with claim 7 and further comprising a fourth plurality of redundant lasers designed to operate at carrier wavelengths outside the range of said carrier wavelengths.

9. A semiconductor laser array in accordance with claim 7 wherein lasers of said first and second pluralities designed to operate at the same carrier wavelength are separated from each other in said optoelectronic circuit chip by other of said lasers.

10. A semiconductor laser array in accordance with claim 9 wherein lasers of said first array are contiguous to each other and lasers of said second array are contiguous to each other.

* * * * *